United States Patent
Chu et al.

(10) Patent No.: US 10,340,435 B2
(45) Date of Patent: Jul. 2, 2019

(54) THERMOELECTRIC CONVERSION DEVICE

(71) Applicant: Industrial Technology Research Institute, Hsinchu (TW)

(72) Inventors: Hsu-Shen Chu, Hsinchu (TW); Cheng-Cho Wong, Hsinchu (TW); Chih-Hao Chang, Taoyuan (TW)

(73) Assignee: Industrial Technology Research Institute, Hsinchu (TW)

( * ) Notice: Subject to any disclaimer, the term of this patent is extended or adjusted under 35 U.S.C. 154(b) by 172 days.

(21) Appl. No.: 14/983,585

(22) Filed: Dec. 30, 2015

(65) Prior Publication Data

US 2017/0148971 A1    May 25, 2017

(30) Foreign Application Priority Data

Nov. 24, 2015   (TW) .............................. 104139032 A

(51) Int. Cl.
*H01L 35/30* (2006.01)
*H01L 35/32* (2006.01)

(52) U.S. Cl.
CPC ............ *H01L 35/325* (2013.01); *H01L 35/30* (2013.01)

(58) Field of Classification Search
CPC .................................................... H01L 35/325
See application file for complete search history.

(56) References Cited

U.S. PATENT DOCUMENTS

| | | |
|---|---|---|
| 6,759,586 B2 | 7/2004 | Shutoh et al. |
| 8,269,098 B2 | 9/2012 | Chu |
| 2003/0066554 A1 | 4/2003 | Feher |
| 2009/0133734 A1 | 5/2009 | Takahashi |
| 2009/0277490 A1 | 11/2009 | Chu |
| 2011/0030389 A1 | 2/2011 | Morisaku et al. |
| 2013/0199593 A1 | 8/2013 | Higashida et al. |
| 2013/0220394 A1 | 8/2013 | Higashida et al. |
| 2015/0207055 A1 | 7/2015 | Mabuchi et al. |

FOREIGN PATENT DOCUMENTS

| | | |
|---|---|---|
| CN | 101587934 | 11/2009 |
| CN | 101840989 | 9/2010 |
| CN | 102751433 | 10/2012 |

(Continued)

OTHER PUBLICATIONS

Yu et al., "A numerical model for thermoelectric generator with the parallel-plate heat exchanger," Journal of Power Sources, Oct. 11, 2007, pp. 428-434.

(Continued)

*Primary Examiner* — Shannon M Gardner
(74) *Attorney, Agent, or Firm* — JCIPRNET

(57) ABSTRACT

A thermoelectric conversion device includes at least one thermoelectric conversion unit. The thermoelectric conversion unit includes at least one first electrode, at least one second electrode, a P-type thermoelectric material, and an N-type thermoelectric material. The first electrode includes a first fluid channel, such that the first electrode has a first hollow structure. The second electrode includes a second fluid channel, such that the second electrode has a second hollow structure. The P-type thermoelectric material is located between the first electrode and the second electrode, and the second electrode is located between the P-type thermoelectric material and the N-type thermoelectric material.

10 Claims, 6 Drawing Sheets

(56) References Cited

FOREIGN PATENT DOCUMENTS

| EP | 1906463 | 4/2008 |
|---|---|---|
| EP | 2282356 | 2/2011 |
| TW | 425729 | 3/2001 |
| TW | 463209 | 11/2001 |
| TW | I338390 | 3/2011 |
| TW | I473310 | 2/2015 |
| WO | 2009041020 | 4/2009 |
| WO | 2014141699 | 9/2014 |

OTHER PUBLICATIONS

Crane et al., "Optimization of cross flow heat exchangers for thermoelectric waste heat recovery," Energy Conversion and Management, Jun. 2004, pp. 1565-1582.

Esarte et al, "Modelling heat exchangers for thermoelectric generators," Journal of Power Sources, Feb. 1, 2001, pp. 72-76.

Xuan et al., "A general model for studying effects of interface layers on thermoelectric devices performance," International Journal of Heat and Mass Transfer, Dec. 2002, pp. 5159-5170.

Pramanick et al., "Constructal design of a thermoelectric device," International Journal of Heat and Mass Transfer, Apr. 2006, pp. 1420-1429.

X.C. Xuan, "Investigation of thermal contact effect on thermoelectric coolers," Energy Conversion and Management, Feb. 2003, pp. 399-410.

"Office Action of Taiwan Counterpart Application", dated Aug. 22, 2016, p. 1-p. 3, in which the listed references were cited.

"Office Action of China Counterpart Application," dated Jul. 2, 2018, pp. 1-7.

THERMOELECTRIC CONVERSION DEVICE

CROSS-REFERENCE TO RELATED APPLICATION

This application claims the priority benefit of Taiwan application serial no. 104139032, filed on Nov. 24, 2015. The entirety of the above- mentioned patent application is hereby incorporated by reference herein and made a part of this specification.

TECHNICAL FIELD

The disclosure is directed to a thermoelectric conversion device.

BACKGROUND

Due to energy shortage crisis, development of renewable energy technologies has become an important topic. Thermoelectric conversion technology is a new renewable energy technology today which is able to directly convert between heat energy and electrical energy. In recent years, the thermoelectric conversion technology has received enormous attention from research institutions in various countries and considerable efforts have been invested in research and development. In addition to development of materials, application of thermoelectric technology has also been the focus of research interest.

A thermoelectric module is one of the products applying the thermoelectric conversion technology. Operation principles of the thermoelectric module will be described in brief as follows. As a direct current (DC) is input to the thermoelectric module, a temperature difference occurs between two terminals of the thermoelectric module, the heat energy is absorbed by the cool terminal, transmitted to the thermal terminal and exhausted from the thermal terminal, so as to achieve a heat pump capability, which is a Peltier effect. On the other hand, if the two terminals of the thermoelectric module have different temperatures, the thermoelectric module generates a direct current, and the greater the temperature difference, the higher the electric power, which is a Seebeck effect.

According to the aforementioned two principles, how to effectively perform the thermoelectric conversion effects occurring in the junction between the thermoelectric materials and the metal electrodes for application is an important subject.

SUMMARY

The disclosure introduces a thermoelectric conversion device. The thermoelectric conversion device includes at least one thermoelectric conversion unit, and the at least one thermoelectric conversion unit includes at least one first electrode, at least one second electrode, a P-type thermoelectric material and an N-type thermoelectric material. The first electrode includes a first fluid channel, such that the first electrode has a first hollow structure. The second electrode has a second fluid channel, such that the second electrode has a second hollow structure. The P-type thermoelectric material is located between the first electrode and the second electrode, and the second electrode is located between the P-type thermoelectric material and the N-type thermoelectric material.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
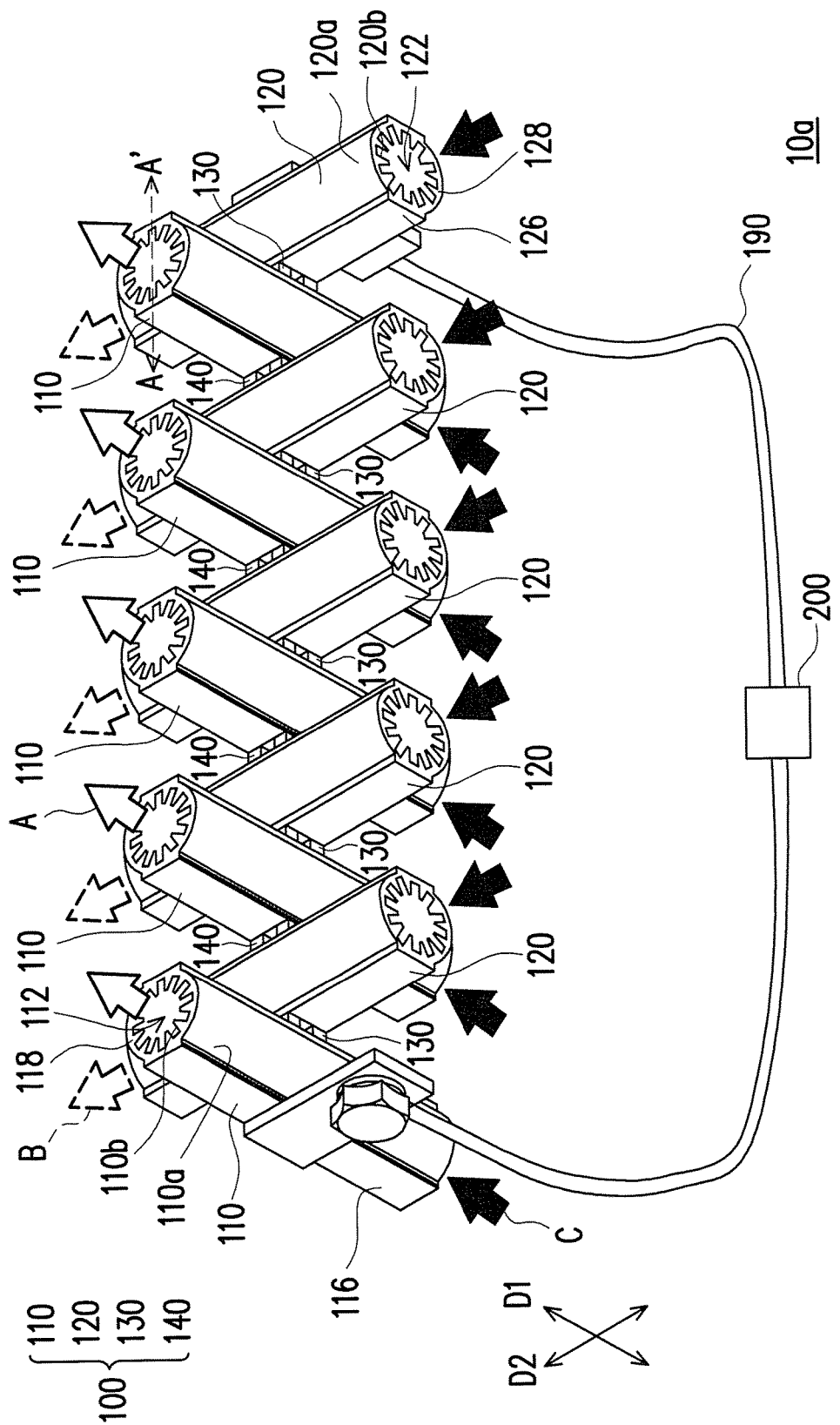
FIG. 1 is a schematic structural diagram illustrating a thermoelectric conversion device according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Moreover, wherever appropriate in the drawings and embodiments, elements/components/steps with the same reference numerals represent the same or similar parts. Elements/components/steps with the same reference numerals or names in different embodiments may be cross-referenced.

Figure 2:
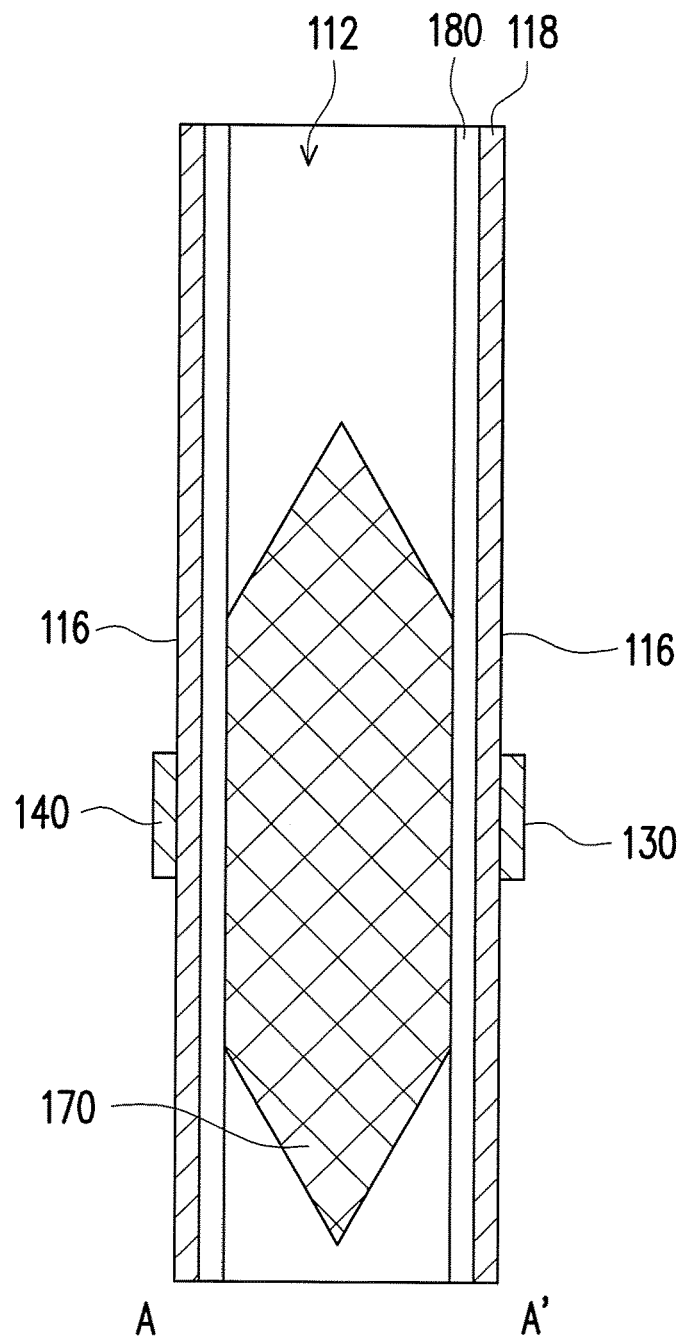
FIG. 2 is a cross-sectional diagram illustrating a first electrode of the thermoelectric conversion device depicted in FIG. 1 along a section line AA'.

FIG. 1 is a schematic structural diagram illustrating a thermoelectric conversion device according to an embodiment of the disclosure. Referring to FIG. 1, a thermoelectric conversion device 10a includes at least one thermoelectric conversion unit 100. FIG. 2 is a cross-sectional diagram illustrating a first electrode of the thermoelectric conversion device depicted in FIG. 1 along a section line AA'. Each thermoelectric conversion unit 100 includes at least one first electrode 110, at least one second electrode 120, a P-type thermoelectric material 130 and an N-type thermoelectric material 140. For instance, in the present embodiment, elements of the thermoelectric conversion unit 100 depicted in FIG. 1 are illustrated as being arranged in a sequence (i.e., the first electrode 110, the P-type thermoelectric material 130, the second electrode 120 and the N-type thermoelectric material 140) as an example, but the disclosure is not limited thereto. In an embodiment, the elements of the thermoelectric conversion unit 100 may also be arranged in a sequence of, for example, the first electrode 110, the N-type thermoelectric material 140, the second electrode 120 and the P-type thermoelectric material 130.

Each first electrode 110 has a first fluid channel 112, such that the first electrode 110 has a hollow structure. Each first electrode 110 has an outer surface 110a and an inner surface 110b. The outer surface 110a of the first electrode 110 includes two regions 116 that are opposite to each other, and each region 116 is disposed with the P-type thermoelectric material 130 or the N-type thermoelectric material 140. The region 116 may be planar or non-planar, and in FIG. 1, the region 116 is illustrated as planar for example. With the regions 116, the P-type thermoelectric material 130 and/or the N-type thermoelectric material 140 can be connected (e.g., by soldering) to the first electrode 110 and the second electrode 120. Each second electrode 120 has a second fluid channel 122, such that the second electrode 120 has a hollow structure. Each second electrode 120 has an outer surface 120a and an inner surface 120b. The outer surface 120a of the second electrode 120 includes two regions 126 that are opposite to each other, and each region 126 is disposed with the P-type thermoelectric material 130 or the N-type thermoelectric material 140. The region 126 may be planar or non-planar, and in FIG. 1, the region 126 is illustrated as planar for example. With the regions 126, the P-type thermoelectric material 130 and/or the N-type thermoelectric material 140 can be connected (e.g., by soldering) to the first electrode 110 and the second electrode 120.

Referring to FIG. 1, the inner surface 110b of the first electrode 110 has groove structures 118, such that the first fluid channel 112 has a non-planar surface, and the inner surface 120b of the second electrode 120 has groove structures 128, such that the second fluid channel 122 has a non-planar surface. In the present embodiment, due to the groove structures 118 disposed on the inner surface 110b of the first electrode 110 and the groove structures 128 disposed on the inner surface 120b of the second electrode 120, a contact area between fluids (e.g., a first fluid A, a second fluid B or an input fluid C) inside the first fluid channel 112 and the first electrode 110 is increased, such that the area for heat exchanging is increased to effectively reduce loss in a thermoelectric conversion efficiency of the thermoelectric conversion device. In the same way, a contact area between the fluids inside the second fluid channel 122 and the second electrode 120 is increased, such that the area for heat exchanging is increased to effectively reduce loss in a thermoelectric conversion efficiency of the thermoelectric conversion device.

Referring to both FIG. 1 and FIG. 2, the thermoelectric conversion device 10a further includes a plurality of fluid dividing plugs 170. In the present embodiment, one of the fluid dividing plugs 170 is disposed in the first fluid channel 112 of the first electrode 110. With the one of the fluid dividing plugs 170, the fluids passing through the first fluid channel 112 are forced to contact the groove structures 116 of the first electrode 110, so as to reinforce the capability of heat exchanging, as shown in FIG. 2. A material of the fluid dividing plugs 170 may include a conductive material or a non-conductive material, but the disclosure is not limited thereto. Additionally, the inner surface 110b of the first electrode 110 may further have an insulation layer 180, and thereby, when the fluids passing through the first fluid channel 112 of the first electrode 110 and the second fluid channel 122 of the second electrode 120 are conductive liquids, a short circuit phenomenon may be avoided. Furthermore, the second electrode 120 may have the same or similar structure of the first electrode 110 and thus will not be repeatedly described. Additionally, in an embodiment, the outer surface 110a of the first electrode 110 and the outer surface 120a of the second electrode 120 may also include a nickel layer or another metal bonding material layer (not shown) capable of increasing a bonding strength between the outer surface 110a of the first electrode 110 and the P-type thermoelectric material 130 and/or the N-type thermoelectric material 140 and between the outer surface 120a of the second electrode 120 and the P-type thermoelectric material 130 and/or the N-type thermoelectric material 140, but the disclosure is not limited thereto.

In addition, the first electrode 110 and the second electrode 120 may be in a circular-pillar shape, a square-pillar shape, a rectangular-pillar shape or a polygonal-pillar shape. For example, in the present embodiment, each of the first electrode 110 and the second electrode 120 may be in a circular-pillar shape having the hollow structure, but the disclosure is not limited thereto. In an embodiment, the first electrode 110 extends along a first direction D1, the second electrode 120 extends along a second direction D2, and the first direction D1 and the second direction D2 have an included angle ranging from 0 degree to 180 degrees, but the disclosure is not limited thereto. The first electrode 110 and the second electrode 120 may be made of metal, alloy or a combination thereof, for example, copper, aluminum, etc., alloy or metal-based composite materials that have a high thermal conductivity, and the first electrode 110 and the second electrode 120 may be made of the same material or different materials.

Referring to FIG. 1, the P-type thermoelectric material 130 is located between the first electrode 110 and the second electrode 120, and the second electrode 120 is located between the P-type thermoelectric material 130 and the N-type thermoelectric material 140. The P-type thermoelectric material 130 may include bismuth, antimony, tellurium or a combination of the compounds listed above. The N-type thermoelectric material 140 may include bismuth, tellurium, selenium or a combination of the compounds listed above. In addition, the P-type thermoelectric material 130 may be a large-area P-type thermoelectric material or composed of a plurality of small-area P-type thermoelectric materials arranged in an array. A shape of the P-type thermoelectric material 130 is, for example, a circular-pillar shape, a square-pillar shape, a rectangular-pillar shape or a polygonal-pillar shape, but the disclosure is not limited thereto. Similarly, the N-type thermoelectric material 140 may be a large-area N-type thermoelectric material or composed of a plurality of small-area N-type thermoelectric materials arranged in an array. A shape of the N-type thermoelectric material 140 is, for example, a circular-pillar shape, a square-pillar shape, a rectangular-pillar shape or a polygonal-pillar shape, but the disclosure is not limited thereto.

Furthermore, referring to FIG. 1, the thermoelectric conversion device 10a further includes a wire 190 and a power system 200. The thermoelectric conversion unit 100 is electrically connected with the power system 200 through the wire 190 to form a complete circuit loop. The power system 200 may be, for example, a power supply apparatus or a power storage apparatus, which is not limited in the disclosure. In the present embodiment, the power system 200 is a DC power supply apparatus, for example.

Figure 3:
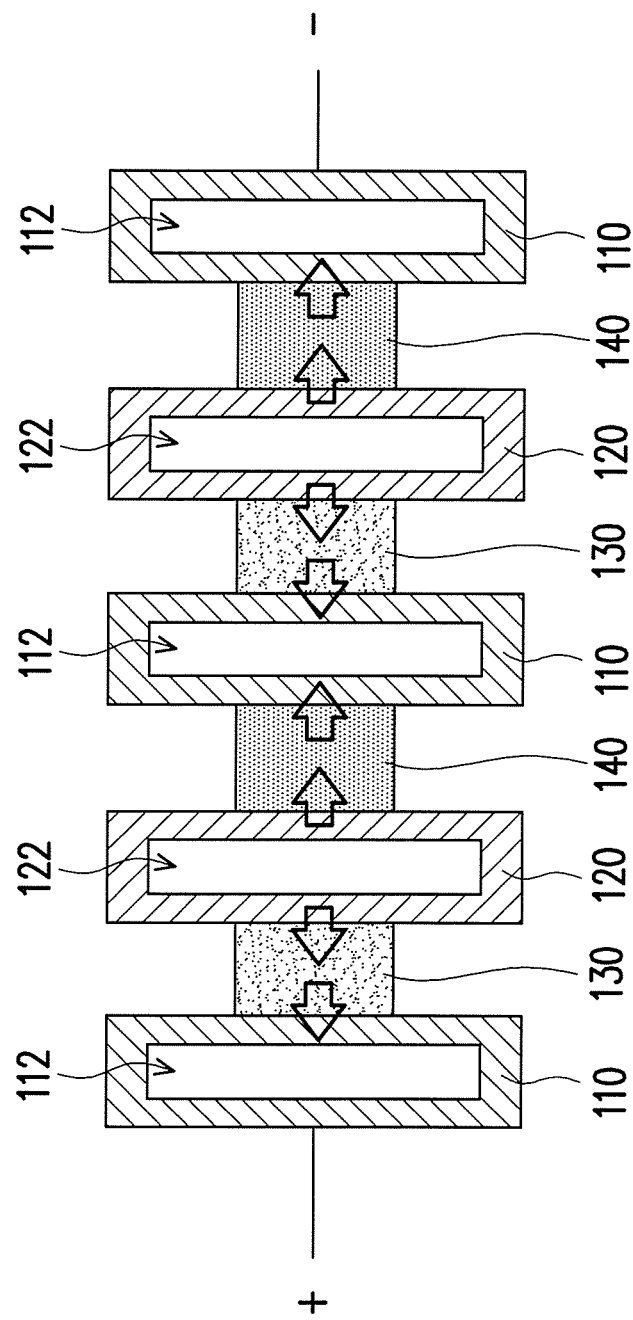
FIG. 3 is a schematic simplified diagram illustrating the thermoelectric conversion device depicted in FIG. 1.

FIG. 3 is a schematic simplified diagram illustrating the thermoelectric conversion device depicted in FIG. 1, and arrows in FIG. 3 are used to indicate transmission directions of electrons. Referring to both FIG. 1 and FIG. 3, in a scenario where the thermoelectric conversion device 10a includes two or more thermoelectric conversion units 100, the first electrode 110 of each thermoelectric conversion unit 100 is connected with the N-type thermoelectric material 140 of another thermoelectric conversion unit 100. The two adjacent thermoelectric conversion units 110 are connected in series to each other. Namely, in the thermoelectric conversion device 10a of the present embodiment, the first electrode 110 is located between the N-type thermoelectric material 140 and the P-type thermoelectric material 130, the P-type thermoelectric material 130 is located between the first electrode 110 and the second electrode 120, the second electrode 120 is located between the P-type thermoelectric material 130 and the N-type thermoelectric material 140, and the N-type thermoelectric material 140 is located between the first electrode 110 and the second electrode 120. In other words, the thermoelectric conversion device 10a of the present embodiment is a cascade structure formed by the elements, including the first electrode 110, the P-type thermoelectric material 130, the second electrode 120, the N-type thermoelectric material 140, the first electrode 110, and the P-type thermoelectric material 130 . . . (and so on), electrically connected with one another, which may contribute to effectively reducing issues of thermal stress accumulation and concentration. Moreover, the thermoelectric materials of the thermoelectric conversion device 10a of the disclosure have flexible size requirements and may contribute to effectively reducing manufacturing cost.

Referring to FIG. 1 and FIG. 3, in a scenario where the thermoelectric conversion device 10a serves as a heating device, its operation is simplified and described in the embodiment below. First, the power system 200 provides a direct current to the thermoelectric conversion unit 100 through the wire 190, holes having positive charges in the P-type thermoelectric material 130 move toward the adjacent second electrode 120, and the electrons having negative charges in the N-type thermoelectric material 140 move toward the adjacent first electrode 110. Thus, the first electrode 110 absorbs the heat and accordingly, is heated, such that the input fluid C passing through the first fluid channel 112 of the first electrode 110 is heated to become the first fluid A having a first temperature. The heat of the second electrode 120 has been absorbed, and accordingly the second electrode 120 is cooled, such that the input fluid C passing through the second fluid channel 122 of the second electrode 120 is cooled to become the second fluid B having a second temperature, where the first temperature is higher than the second temperature. In this way, the thermoelectric conversion device 10a of the present embodiment achieves a capability of heat pump by means of the Peltier effect.

On the other hand, the thermoelectric conversion device 10a may also serve as a power generation device according to another embodiment, which will be described below. In the present embodiment, the power system 200 may serve as a power storage apparatus. First, the first fluid A having a first temperature is input into the first fluid channel 112 of the first electrode 110, and the second fluid B having a second temperature is input into the second fluid channel 122 of the second electrode 120, where the first temperature is higher than the second temperature, such that a temperature difference appears between the first electrode 110 and the second electrode 120. Thus, the holes having positive charges in the P-type thermoelectric material 130 move toward the adjacent second electrode 120, and the electrons having negative charges in the N-type thermoelectric material 140 move toward the adjacent first electrode 110 and so on, which generates a electrical current. The electric current generated based on the Seebeck effect may be provided to the power system 200 through the wire 190 for generating electricity.

As described above, in the present embodiment, the first electrode 110 has the first fluid channel 112, such that the first electrode 110 has the hollow structure, and the second electrode 120 has the second fluid channel 122, such that the second electrode 120 has the hollow structure. Thus, the fluids flowing into the first fluid channel 112 and the second fluid channel fluids 122 directly contact the first electrode 110 and the second electrode 120, such that the heat energy of the fluids is directly transmitted to the first electrode 110 and the second electrode 120, as well as transmitted to the P-type thermoelectric material 130 and the N-type thermoelectric material 140. In other words, the heat energy of the fluids does not have to pass through other heat exchangers, and thus the present embodiment achieves effectively converting the heat energy of the fluids into electrical energy. In addition, since the first electrode 110 and the second electrode 120 are arranged in a cascade form, the electric current generated thereby is transmitted in a linear direction and thereby, the power consumption may be reduced.

Figure 4:
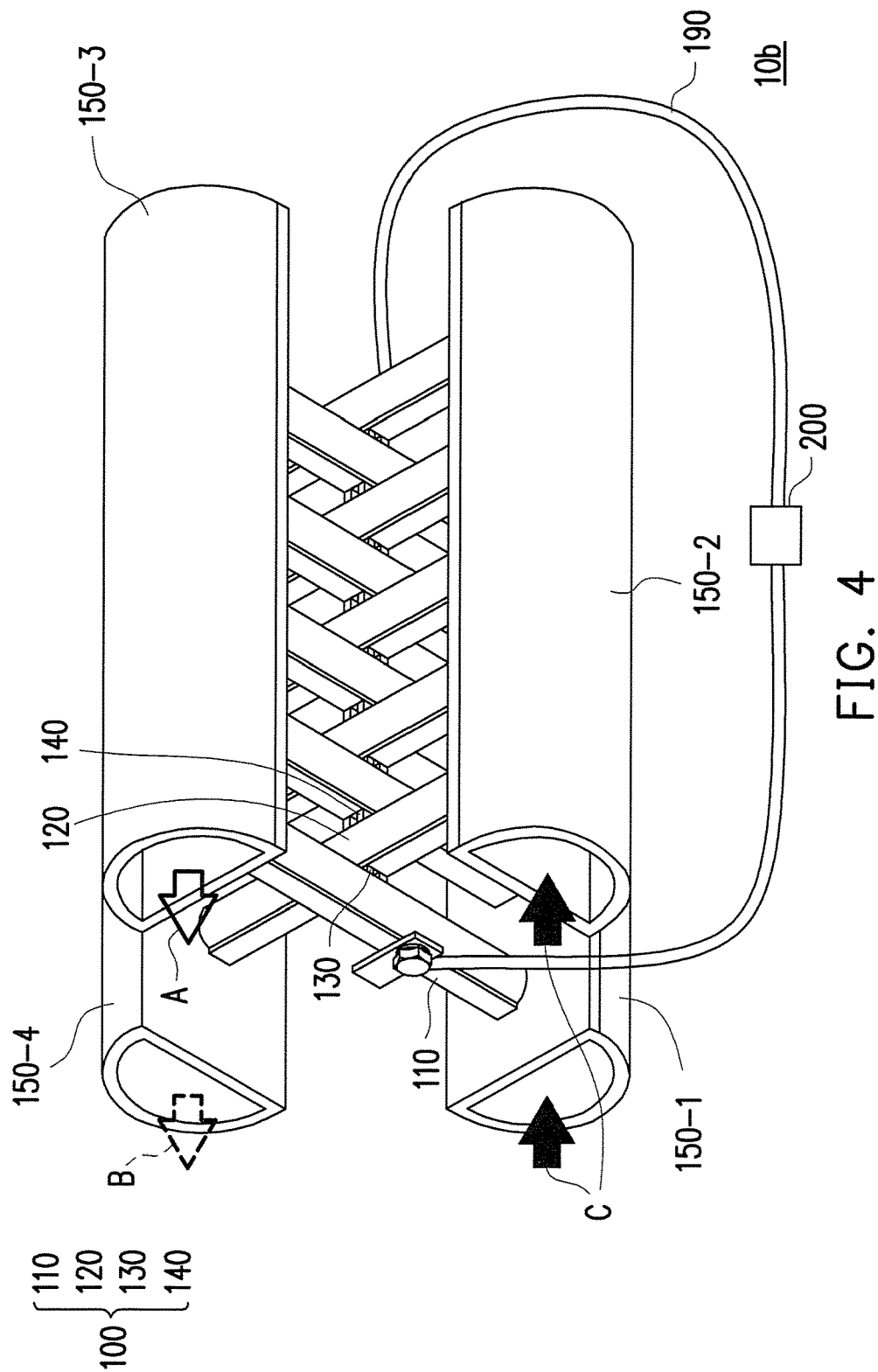
FIG. 4 is a schematic structural diagram illustrating a thermoelectric conversion device according to another embodiment of the disclosure.

FIG. 4 is a schematic structural diagram illustrating a thermoelectric conversion device according to another embodiment of the disclosure. A thermoelectric conversion device 10b of the embodiment illustrated in FIG. 4 is similar to the thermoelectric conversion device 10a illustrated in FIG. 1, thus the same or similar elements are labeled by the same or similar symbols and will not be repeatedly described. The present embodiment illustrated in FIG. 4 and the embodiment illustrated in FIG. 1 are mainly different in the thermoelectric conversion device 10b further including at least four insulation conduits 150-1, 150-2, 150-3 and 150-4. The four insulation conduits 150-1 to 150-4 respectively connect with the first fluid channel 112 of the first electrode 110 and the second fluid channel 122 of the second electrode 120.

Specifically, one terminal of the first fluid channel 112 of the first electrode 110 connects with the insulation conduit 150-1, and the other terminal of the first fluid channel 112 of the first electrode 110 connects with the insulation conduit 150-3. One terminal of the second fluid channel 122 of the second electrode 120 connects with the insulation conduit 150-2, and the other terminal of the second fluid channel 122 of the second electrode 120 connects with the insulation conduit 150-4. In other words, the first fluid channel 112 has two terminals, and the second fluid channel 122 has two terminals, in which each of the two terminals of the first fluid channel 112 and the two terminals of the second fluid channel 122 respectively connects with different insulation conduits 150-1 to 150-4. It should be noted that the insulation conduits 150-1 to 150-4 can be made of an electrically insulating material to avoid the occurrence of a DC short circuit.

Referring to FIG. 4, in the present embodiment, the direct current is provided by the power system 200 to the thermoelectric conversion device 10b through the wire 190. Thus, when being provided to the insulation conduit 150-1, the input fluid C flows into the first fluid channel 112 of each first electrode 110 of the thermoelectric conversion device 10b through the insulation conduit 150-1 and exchanges the heat with the inner surface 110b of the first electrode 110 to form the first fluid A. Then, after being collected and aggregated to the insulation conduit 150-3, the first fluid A is exhausted from the thermoelectric conversion device 10b through the insulation conduit 150-3. Similarly, when being provided to the insulation conduit 150-2, the input fluid C flows into the second fluid channel 122 of each second electrode 120 of the thermoelectric conversion device 10b through the insulation conduit 150-2 and exchanges the heat with the inner surface 120b of the second electrode 120 to form the second fluid B. Then, after being collected and aggregated to the insulation conduit 150-4, the second fluid B is exhausted from the thermoelectric conversion device 10*b*. In this way, the thermoelectric conversion device 10*b* of the present embodiment is provided with a capability of heat pump.

Additionally, in an embodiment, the power system 200 may not be a power supply apparatus providing the direct current to the thermoelectric conversion device 10*b*, but a power storage apparatus. By providing two fluids (e.g., the first fluid A and the second fluid B) with a temperature difference therebetween to the insulation conduit 150-1 and the insulation conduit 150-2 respectively, a electric current is generated due to the temperature difference between the two fluids (i.e., the Seebeck effect), and thus the thermoelectric conversion device 10*b* is provided with the electricity generating capability.

Figure 5:
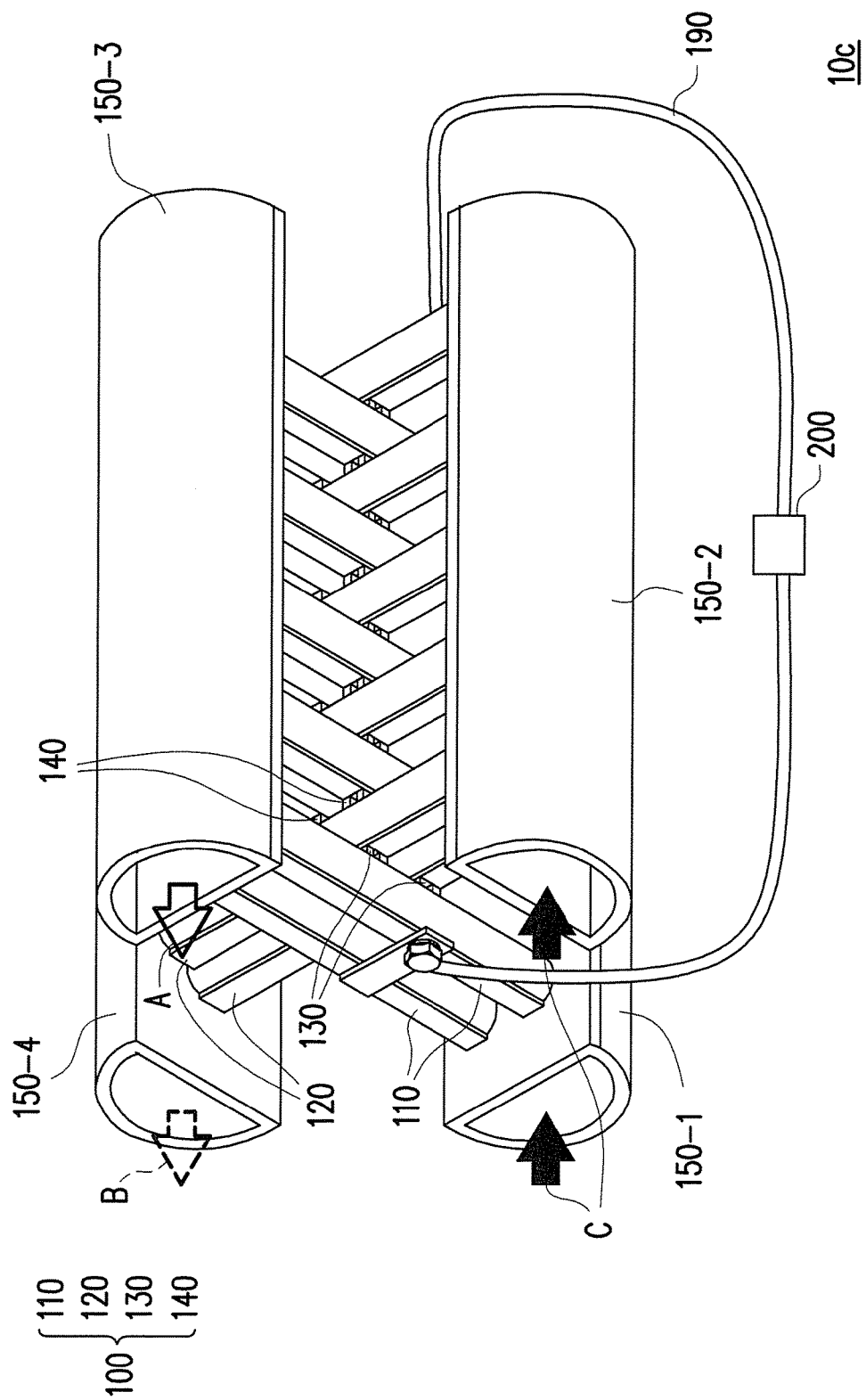
FIG. 5 is a schematic structural diagram illustrating a thermoelectric conversion device according to another embodiment of the disclosure.

FIG. 5 is a schematic structural diagram illustrating a thermoelectric conversion device according to another embodiment of the disclosure. A thermoelectric conversion device 10*c* illustrated in FIG. 5 is similar to the thermoelectric conversion device 10*b* illustrated in FIG. 4, thus, the same or similar elements are labeled by the same or similar symbols and will not be repeatedly described. The present embodiment illustrated in FIG. 5 and the embodiment illustrated in FIG. 4 are mainly different in the thermoelectric conversion unit 100 of the thermoelectric conversion device 10*c* including two first electrodes 110 and two second electrodes 120. However, the disclosure is not limited thereto, and in other embodiments, the thermoelectric conversion unit has two or more first electrodes 110 and two or more second electrodes 120.

Referring to FIG. 5, as being similar to the thermoelectric conversion device 10*b* illustrated in FIG. 4, in the thermoelectric conversion unit 100 of the thermoelectric conversion device 10*c*, terminals of the first fluid channels 112 of the two first electrodes 110 at the same side connect with the insulation conduit 150-1, while the other terminals connect with the insulation conduit 150-3; and terminals of the second fluid channels 122 of the two second electrodes 120 at the same side connect with the insulation conduit 150-2, while the other terminals connect with the insulation conduit 150-4. In other words, the two first electrodes 110 of each thermoelectric conversion unit 100 of the thermoelectric conversion device 10*c* are connected in parallel, and the two second electrodes 120 are also connected in parallel. Based on such structure, the fluids in the first fluid channel 112 of each first electrode 110 and the second fluid channel 122 of each second electrode 120 are exhausted from the thermoelectric conversion device 10*c* after going through the heat exchanging process (i.e., the heating process or the cooling process) for two or more times, and the effect of the heat pump capability of the thermoelectric conversion device 10*c* may be thereby improved. Being similar to the thermoelectric conversion device 10*b*, two fluids (e.g., the first fluid A and the second fluid B) with a temperature difference therebetween are provided to insulation conduit 150-1 and the insulation conduit 150-2 respectively, a electric current is generated based on the temperature difference, and thus the thermoelectric conversion device 10*c* is provided with the electricity generating capability.

Figure 6:
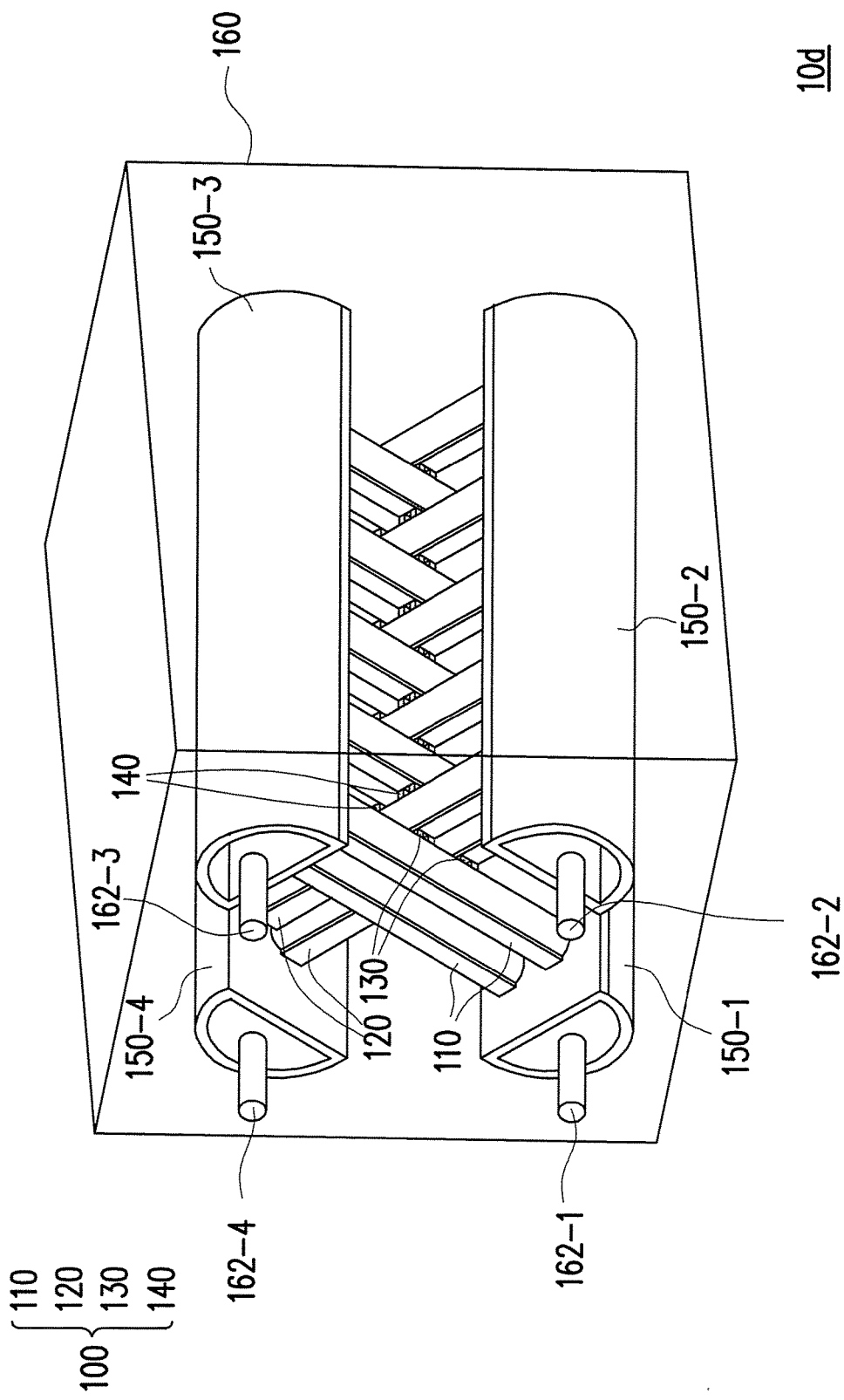
FIG. 6 is a schematic structural diagram illustrating a thermoelectric conversion device according to another embodiment of the disclosure.

FIG. 6 is a schematic structural diagram illustrating a thermoelectric conversion device according to another embodiment of the disclosure. A thermoelectric conversion device 10*d* illustrated in FIG. 6 is similar to the thermoelectric conversion device 10*c* illustrated in FIG. 5, thus the same or similar elements are labeled by the same or similar symbols and will not be repeatedly described. The present embodiment illustrated in FIG. 6 and the embodiment illustrated in FIG. 5 are mainly different in the thermoelectric conversion device 10*d* further including a casing 160. Specifically, the casing 160 of the thermoelectric conversion device 10*d* covers each thermoelectric conversion unit 100 and the insulation conduits 150-1 to 150-4. The casing 160 has at least four ports 162-1 to 162-4 respectively connected with the insulation conduits 150-1 to 150-4. The disposition of the casing 160 may achieve structural protection for the thermoelectric conversion device 10*d*, and by disposing all the ports 162-1 to 162-4 on the same surface of the casing 160, entrances and exits of the insulation conduits 150-1 to 150-4 in the thermoelectric conversion device 10*d* for the fluids may be located in the same surfaces, such that the appearance of the thermoelectric conversion device 10*d* may be simplified more. In other embodiments, the ports 162-1 to 162-4 may also be disposed on different surfaces of the casing 160, and the disclosure is not limited thereto. The casing 160 is made of an insulating material, such as an electrically insulating material, a thermally insulating material or an electrically and thermally insulating material. In addition, a wire and a power system (not shown) of thermoelectric conversion device 10*d* may selectively disposed inside or outside the casing 160, which is not limited in the disclosure.

[Test of Heat Pump Capability]

First, a thermocouple is electrically coupled to the thermoelectric conversion device 10*a* illustrated in FIG. 1, and then a direct current is provided by the power system 200 for testing the heat pump capability. Measurements of Test 1 and Test 2 are performed in the air, and a measurement of Test 3 is performed in the water, conditions and measurement results of the tests are listed in Table 1 below:

TABLE 1

|  | Test 1 | Test 2 | Test 3 |
| --- | --- | --- | --- |
| Input power (W) | 9.8 | 60 | 60 |
| Temperature of the first electrode (° C.) | 26 | 52 | 27 |
| Temperature of the second electrode (° C.) | 13 | 13 | 17 |
| Temperature difference between the first and the second electrodes (° C.) | 13 | 38 | 10 |
| Ambient temperature (° C.) | 18 | 19 | 19 |

According to Table 1 above, in spite of in the air or in the water, the thermoelectric conversion device 10*a* introduced by the disclosure is proved to be provided with the heat pump capability that a thermoelectric element should have.

[Test of Electricity Generating Capability]

The wire 190 of the thermoelectric conversion device 10*a* illustrated in FIG. 1 is connected with a voltage detecting device. Water with a temperature about 55° C. and water with a temperature about 25° C. are guided into the first fluid channel 112 of the first electrode 110 and the second fluid channel 122 of the second electrode 120, and an open-circuit voltage ($V_{oc}$) detected by the voltage detecting device is about 32 mV. Accordingly, the thermoelectric conversion device 10*a* introduced by the disclosure is proved to be provided with the electricity generating capability that a thermoelectric element should have.

In light of the foregoing, the thermoelectric conversion device introduced by the disclosure has a cascade structure formed by the elements, including the first electrode, the P-type thermoelectric material, the second electrode, the N-type thermoelectric material, the first electrode, the P-type thermoelectric material . . . (and so on), electrically connected with one another, which can effectively suppress thermal stress accumulation and concentration, have flexible size requirements and effectively reducing manufacturing cost.

In the thermoelectric conversion device introduced by the disclosure, the thermoelectric conversion occurring in the junction between the thermoelectric materials and the metal electrodes can be applied without being conducted through an insulating substrate; and in this way, applicable capabilities can be prevented from being reduced due to thermal resistance of the insulating substrate. Moreover, the heat does not have to be exchanged at an outer surface of the insulating substrate, which can prevent further loss of the thermoelectric conversion efficiency of the thermoelectric module.

In addition, the first electrode of the embodiments of the disclosure has the first fluid channel, so as to have the hollow structure, and the second electrode has the second fluid channel, so as to have the hollow structure. Therefore, the heat of the fluids flowing into the first fluid channel and the second fluid channel can be directly transmitted to the first electrode and the second electrode, as well as transmitted to the P-type thermoelectric material and the N-type thermoelectric material. In other words, the heat energy of the fluids does not have to pass through other heat exchangers (e.g., insulating substrates), and thus the disclosure can effectively convert the heat energy of the fluids into the electrical energy.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A thermoelectric conversion device, comprising at least one thermoelectric conversion unit, wherein each of the at least one thermoelectric conversion unit comprising:
   at least one first electrode, having a first fluid channel embedded therein, so as to form a hollow structure;
   at least one second electrode, having a second fluid channel embedded therein, so as to form a hollow structure;
   a P-type thermoelectric material, located between each of the at least one first electrode and each of the at least one second electrode; and
   an N-type thermoelectric material, wherein each of the at least one second electrode is located between the P-type thermoelectric material and the N-type thermoelectric material; and
   at least four insulation conduits, wherein each of two terminals of the first fluid channel and two terminals of the second fluid channel respectively connects with different insulation conduits,
   wherein each of the at least one first electrode, the P-type thermoelectric material, each of the at least one second electrode, and the N-type thermoelectric material are arranged in a sequence along a direction.

2. The thermoelectric conversion device according to claim 1, wherein the at least one thermoelectric conversion device comprises two or more thermoelectric conversion units, and the at least one first electrode of each of the two or more thermoelectric conversion units is connected with the N-type thermoelectric material of another thermoelectric conversion unit of the two or more thermoelectric conversion units.

3. The thermoelectric conversion device according to claim 2, wherein every two thermoelectric conversion units of the two or more thermoelectric conversion units are connected in series.

4. The thermoelectric conversion device according to claim 1, wherein each of the at least one first electrode has an outer surface, each of the at least one second electrode has an outer surface, each of the outer surface of the at least one first electrode and the outer surface of the at least one second electrode has two opposite regions, wherein each of the regions is disposed with the N-type thermoelectric material or the P-type thermoelectric material.

5. The thermoelectric conversion device according to claim 1, wherein each of the at least one first electrode has an inner surface, each of the at least one second electrode has an inner surface, and each of the inner surface of the at least one first electrode and the inner surface of the at least one second electrode has a plurality of groove structures.

6. The thermoelectric conversion device according to claim 1, wherein each of the at least one first electrode has an inner surface, each of the at least one second electrode has an inner surface, and each of the inner surface of the at least one first electrode and the inner surface of the at least one second electrode has an insulation layer.

7. The thermoelectric conversion device according to claim 1, further comprising a casing covering the at least one thermoelectric conversion unit, wherein the casing has at least four ports respectively connected with the insulation conduits.

8. The thermoelectric conversion device according to claim 1, wherein each of the at least one thermoelectric conversion unit has two or more first electrodes and two or more second electrodes, wherein in each of the at least one thermoelectric conversion unit, the two or more first electrodes are connected in parallel and the two or more second electrodes are connected in parallel.

9. The thermoelectric conversion device according to claim 1, further comprises a plurality of fluid dividing plugs, wherein at least one of the fluid dividing plugs is disposed in the first fluid channel of the at least one first electrode, and at least one of the fluid dividing plugs is disposed in the second fluid channel of the at least one second electrode.

10. The thermoelectric conversion device according to claim 1, wherein shapes of the at least one first electrode and the at least one second electrode comprises a circular-pillar shape, a square-pillar shape, a rectangular-pillar shape or a polygonal-pillar shape.

* * * * *